(12) United States Patent
Keita et al.

(10) Patent No.: US 7,956,338 B2
(45) Date of Patent: Jun. 7, 2011

(54) OPTOELECTRONIC APPARATUS FOR TRANSMITTING DIGITAL AND/OR ANALOG SIGNALS BETWEEN GALVANICALLY SEPARATED CIRCUITS

(75) Inventors: Mamadi Keita, Basel (CH); Simon Antoine, St. Louis (FR); Stefanie Berchtold, Münchenstein (CH)

(73) Assignee: Endress + Hauser Flowtec AG, Reinach (CH)

( * ) Notice: Subject to any disclaimer, the term of this patent is extended or adjusted under 35 U.S.C. 154(b) by 325 days.

(21) Appl. No.: 11/896,961

(22) Filed: Sep. 7, 2007

(65) Prior Publication Data
US 2008/0087850 A1 Apr. 17, 2008

Related U.S. Application Data

(60) Provisional application No. 60/842,948, filed on Sep. 8, 2006.

(30) Foreign Application Priority Data

Sep. 8, 2006 (DE) .................. 10 2006 042 806

(51) Int. Cl.
*G02B 27/00* (2006.01)
(52) U.S. Cl. .......................... 250/551; 250/216
(58) Field of Classification Search .................. 250/551, 250/216
See application file for complete search history.

(56) References Cited

U.S. PATENT DOCUMENTS

| | | | |
|---|---|---|---|
| 3,774,021 A | 11/1973 | Johnson | |
| 4,100,422 A | 7/1978 | Thillays | |
| 4,124,860 A | 11/1978 | Johnson | |
| 4,254,333 A * | 3/1981 | Bergstrom | 250/221 |
| 4,307,297 A | 12/1981 | Groff | |
| 4,367,483 A | 1/1983 | Takahashi | |
| 4,654,771 A | 3/1987 | Stasch | |
| 4,975,571 A * | 12/1990 | McMurtry et al. | 250/231.16 |
| 5,349,504 A | 9/1994 | Simms | |

(Continued)

FOREIGN PATENT DOCUMENTS

DE 44 40 976 A1 5/1996
(Continued)

*Primary Examiner* — Georgia Y Epps
*Assistant Examiner* — Kevin Wyatt
(74) *Attorney, Agent, or Firm* — Bacon & Thomas, PLLC (57) ABSTRACT

The apparatus includes: At least one light-emitting, optoelectronic, functional element, which, during operation, activated by an electrical signal, emits light, at least at times; at least one light-sensitive, optoelectronic, functional element, which, during operation, activated by light falling thereon, delivers, at least at times, an electrical signal; and at least a third, light-conducting, functional element composed at least partially of transmissive material, especially translucent plastic or glass. The third functional element conveys, during operation, light coupled thereinto, and has at least one essentially planar boundary surface, which deflects light conveyed in the apparatus. The at least one, essentially planar, light-deflecting, boundary surface has a surface normal, which is inclined at least with respect to the principal ray axis at least of one of the two optoelectronic, functional elements, with an imaginary principal ray axis of the functional element representing a direction of maximum intensity of the light emitted therefrom during operation and an imaginary principal ray axis of the second functional element representing a direction of its maximum sensitivity to light incoming during operation. The apparatus of the invention is distinguished by a very simple construction, with a relatively high light coupling factor, and is especially suited for use as an optocoupler for field devices of industrial measurements and automation technology.

19 Claims, 1 Drawing Sheet

U.S. PATENT DOCUMENTS

| | | | |
|---|---|---|---|
| 5,614,131 A | 3/1997 | Mukerji | |
| 6,509,574 B2 | 1/2003 | Yuan | |
| 6,624,418 B1 | 9/2003 | Braunwarth | |
| 6,633,030 B2 | 10/2003 | Joshi | |
| 6,650,401 B2 * | 11/2003 | Oka | 356/3.01 |
| 6,684,340 B1 | 1/2004 | Lubcke | |
| 6,744,371 B1 * | 6/2004 | Schmitt et al. | 340/602 |
| 6,870,176 B2 * | 3/2005 | Rohrbacher et al. | 250/551 |
| 6,947,620 B2 | 9/2005 | Florin | |
| 2003/0030790 A1 * | 2/2003 | Rakucewicz | 356/128 |
| 2004/0036888 A1 * | 2/2004 | Gupta et al. | 356/491 |

FOREIGN PATENT DOCUMENTS

| | | |
|---|---|---|
| DE | 101 63 726 A1 | 7/2002 |
| EP | 0 103 032 A1 | 3/1984 |
| EP | 0 525 920 A1 | 2/1993 |
| JP | 57 1212 86 A | 7/1982 |
| JP | 5712 1285 A | 7/1982 |
| JP | 6122 5879 A | 10/1986 |
| JP | 1105 4789 A | 2/1999 |
| JP | 2006 147836 A | 6/2006 |
| WO | WO 2004/048905 A1 | 6/2004 |
| WO | WO 2005/091689 A1 | 9/2005 |

* cited by examiner

OPTOELECTRONIC APPARATUS FOR TRANSMITTING DIGITAL AND/OR ANALOG SIGNALS BETWEEN GALVANICALLY SEPARATED CIRCUITS

CROSS-REFERENCES

This application is a Nonprovisional application of U.S. Provisional Application 60/842,948 filed on Sep. 8, 2006 and claims the benefit of German application numbers 102006042806.4 filed on Sep. 8, 2006.

FIELD OF THE INVENTION

The invention relates to an optoelectronic apparatus, especially one usable as an optocoupler, including: A light-emitting, optoelectronic, functional element; a light-sensitive, optoelectronic, functional element; and a light-conducting, functional element composed, at least in part, of transmissive material, such as e.g. translucent plastic or glass.

BACKGROUND OF THE INVENTION

Such optoelectronic apparatuses with light-transmitter, light-conductor and light-receiver are used, for example, for transmitting digital and/or analog signals between galvanically separated circuits.

Galvanic separation of circuits is required especially in various areas of industrial measurements and automation technology, when explosion protection specifications apply. For example, in the case of field devices used for measuring and/or controlling flow, pressure, fill level, temperature and/or the like, galvanic separation is used for achieving explosion protection. Galvanic separation is, in such cases, to be provided both for the field devices commonly referred to as 4-conductor devices, which are supplied with electrical energy, or power, over at least one special grid line, and, as required, for the field devices commonly referred to as 2-conductor devices, in the case of which energy supply and data transmission occur over one and the same line. Examples of field devices having an apparatus formed as an optocoupler for galvanically separating circuits are described in, among others, EP-A 525 920, U.S. Pat. Nos. 6,684,340, 6,624,418, 4,654,771, or WO-A 04/048905.

Apparatuses of the aforementioned kind suitable as optocouplers are described, for example, in EP-A 103 032, U.S. Pat. Nos. 6,947,620, 6,633,030, 6,509,574, 5,614,131, 5,349, 504, 4,367,483, 4,307,297, 4,124,860, 4,100,422 or 3,774, 021. The optoelectronic apparatuses disclosed therein have, in each case, at least one light-emitting, optoelectronic, first functional element, for example a light-emitting diode, as well as at least one light-sensitive, optoelectronic, second functional element, for example a photodiode. The light emitting functional element is appropriately caused to function during operation by an electrical signal and emits, at least at times, light, while the light-sensitive, functional element is caused to function by light appropriately falling thereon. For transmitting light emitted from the light emitting, functional element to the light-sensitive, functional element, there is additionally provided in the optoelectronic apparatus, in each case, at least one light-conducting, third functional element composed, at least in part, of transmissive material, for example, translucent plastic or glass. During operation, this third functional element conveys light coupled into it. The third functional element has a first boundary surface facing, and in-coupling light from, the first functional element, and a second boundary surface, in turn, out-coupling internally conveyed light. The second boundary surface faces the second functional element. The light-coupling, boundary surfaces of the third functional element of the apparatuses disclosed in EP-A 103 032, U.S. Pat. Nos. 6,947,620, 6,633,030, 6,509,574, 5,614,131, 4,367,483, 4,307,297, 4,124,860, 4,100,422 or 3,774,021 are, in each case, formed essentially planarly. Additionally, such surfaces also have, in each case, a surface normal extending parallel to an imaginary principal ray axis of the, in each case, associated optoelectronic, functional element. In this connection, the imaginary principal ray axis of the first functional element represents a direction of maximum intensity of the light emitted during operation from the first functional element, while an imaginary principal ray axis of the second functional element represents a direction of maximum sensitivity of the second functional element to light incoming during operation. Alternatively to the aforementioned planar, light-coupling boundary-surfaces, it is possible, as proposed, for example, in U.S. Pat. Nos. 6,947, 620 or 5,349,504, additionally also to use lens-shaped, light-coupling boundary-surfaces on functional elements of the described kind.

In order that such optoelectronic apparatuses used for signal transmission can satisfy the explosion protection required in industrial measurements and automation technology, also minimum spacings must be maintained between galvanically separated, current conducting components, as well as also minimum values for air distances, insulation thicknesses, and current creep paths. Thus, for instance, in the case of a maximum allowable voltage of 375 V, the air distances and creep path lengths between galvanically separated circuits are 10 mm and the thickness of solid insulation must amount to at least 1 mm. These distances, or separations, relate, in such case, especially to the minimum separations between the connections and conductor traces of the circuits coupled by means of such optoelectronic apparatuses and carrying electrical current during operation. Furthermore, these apparatuses serving as optocouplers must fulfill increased requirements with respect to temperature resistance and explosion endangerment risk, as well as also with respect to possible damage scenarios associated with possibly occurring overloads.

In order, despite the demanding technical aspects of the safety requirements, to enable for such optoelectronic apparatuses a highest possible light-coupling factor, as well as compact as possible physical shape, their functional elements serving as light conductors are usually, as shown for example in U.S. Pat. Nos. 6,947,620, 5,614,131, 4,367,483 or 4,124, 860, formed in the manner of optical lenses, at least in regions which are to redirect the transmitted light at least partly by reflection, especially also total reflection.

However, the manufacture of light conductors, which are partially lens-shaped, is relatively complicated. Additionally, the lens form of the light conductor, be it in the regions of the light-reflecting boundary surfaces or in the regions of the above-mentioned, light coupling boundary surfaces, also requires a precise positioning and orienting of each of the functional elements directly participating in the optical transmission, along with an increased adjustment effort during manufacture or during installation. This is especially true also for the case in which, as also proposed, for example, in U.S. Pat. No. 6,947,620, the optoelectronic apparatus is to be created first in the course of populating circuit boards carrying the circuits. As a result of this, in turn, also the manufacture of such an optoelectronic apparatus is, altogether, comparatively expensive.

SUMMARY OF THE INVENTION

Considering these points, it is an object of the invention to provide an economical optoelectronic apparatus of the described kind suitable for use in a field device. The apparatus should be simple to construct and simple to assemble, especially also simple to align. Additionally, the apparatus should be embodied in such a manner that it can be built as compactly as possible and, as required, also be manufactured using SMD (surface mounted device) technology. Moreover, the optoelectronic apparatus should satisfy, as comprehensively as possible, relevant explosion protection requirements, without harming a highest possible degree of light coupling, or highest possible data transmission rates, as the case may be, and, as a result, it should be suited also for application in field devices destined to serve in explosion-endangered zones.

For achieving the object, the invention resides in an optoelectronic apparatus including: At least one light-emitting, optoelectronic, first functional element, which, during operation, activated by an electrical signal, emits light, at least at times; at least one light-sensitive, optoelectronic, second functional element, which, during operation, activated by light falling thereon, delivers, at least at times, an electrical signal; and at least one, light-conducting, third functional element composed, at least in part, of transmissive material, for example translucent plastic or glass, and having at least one, essentially planar, boundary surface, which deflects light conveyed in the apparatus. In the case of the apparatus of the invention, the third functional element is additionally so embodied that the at least one, essentially planar, light-deflecting boundary surface of the third functional element has a surface normal, which is inclined at least with respect to an imaginary principle beam axis of at least one of the two optoelectronic functional elements, with an imaginary principal ray axis of the first functional element representing a direction of maximum intensity of light emitted during operation by the first functional element and an imaginary principal ray axis of the second functional element representing a direction of maximum sensitivity of the second functional element to light incoming during operation.

In a first embodiment of the invention, it is provided that the surface normal of the at least one, essentially planar, light-deflecting boundary surface of the third functional element is inclined both with respect to the principal ray axis of the first functional element as well as also with respect to the principal ray axis of the second functional element.

In a second embodiment of the invention, it is provided that the third functional element has a first boundary surface facing the first functional element and a second boundary surface facing the second functional element, with the first boundary surface, during operation, coupling into the third functional element light emitted from the first functional element, and the second boundary surface, during operation, coupling light conveyed within the third functional element out in the direction of the second functional element. In a first further development of this embodiment of the invention, it is additionally provided that at least one of the two light coupling boundary surfaces of the third functional element is constructed essentially planarly and additionally has a surface normal which is inclined at least with respect to the principal ray axis of at least one of the two optoelectronic functional elements. In a second additional development of the second embodiment of the invention, it is further provided that the functional elements are so constructed and so arranged in the apparatus that the surface normal of the at least one essentially planar, light-coupling, boundary surface of the third functional element is inclined at least with respect to the principal ray axis of the associated optoelectronic functional element. In a third further development of the second embodiment of the invention, it is additionally provided that the third functional element is so constructed that each of its two light-coupling, boundary surfaces is constructed essentially planarly. In a fourth additional development of the second embodiment of the invention, it is further provided that the functional elements are so constructed and so arranged in the apparatus that each of the two light coupling, boundary surfaces of the third functional element additionally exhibit surface normals that are inclined with respect to the principal ray axis of their corresponding optoelectronic functional elements. In a fifth additional development of the second embodiment of the invention, it is further provided that the third functional element is so constructed that its two light-coupling, boundary surfaces are so directed with respect to one another that a smallest angle of intersection included between their surface normals extended over the third functional element amounts to less than 120°, especially less than 90°, and/or that the smallest angle of intersection included between their surface normals amounts to more than 10°, especially more than 20°. In a sixth further development of the second embodiment of the invention, it is additionally provided that the functional elements are so constructed and so arranged in the apparatus that the surface normal of the first boundary surface of the third functional element includes with the principal ray axis of the associated first functional element a smallest angle of intersection which is essentially equal to a smallest angle of intersection included between the surface normal of the second boundary surface of the third functional element and the principal ray axis of the associated second functional element.

In a third embodiment of the invention, it is provided that the third functional element has an essentially planar, third boundary surface, which, during operation, reflects, especially totally reflects, light conveyed within the third functional element, especially light to be conveyed in the direction of the second functional element. In a further development of this embodiment of the invention, it is provided that at least the light-reflecting, third boundary surface of the third functional element has a surface normal, which includes with the surface normal of the at least one of the two light-coupling boundary surfaces of the third functional element a smallest angle of intersection which is greater than zero. In a further development of this embodiment of the invention, it is further provided that the first boundary surface of the third functional element coupling light from the first functional element is planarly constructed and is inclined at least with respect to the third boundary surface reflecting its light, in such a manner that the smallest angle of intersection included between their two surface normals is more than 10°, especially greater than 30°.

In a fourth embodiment of the invention, it is provided that the third functional element has a plurality of essentially planar, light deflecting, especially also totally reflecting, boundary surfaces for light conveyed in the third functional element, especially light to be conveyed toward the second functional element.

In a fifth embodiment of the invention, it is provided that the at least one planar, light-deflecting, boundary surface of the third functional element is formed by means of a facet formed therein, especially a facet ground therein. In a further development of this embodiment of the invention, the third functional element has a plurality of essentially planar facets forming deflecting boundary surfaces.

In a sixth embodiment of the invention, the third functional element is embodied in such a manner that a side view thereof describes a convex polygon with n vertices, with n being greater than three, especially equal to or greater than five. In a further development of this embodiment of the invention, the third functional element is embodied in such a manner that the polygon described by the side view of the third functional element is essentially symmetrically formed with respect to at least one principal axis of the same side view. In another further development of the invention, the third functional element is embodied in such a manner that an imaginary axis of symmetry of the polygon described by the side view of the third functional element includes with each of the two principal ray axes an essentially equal angle of intersection.

In a seventh embodiment of the invention, it is provided that the two optoelectronic, functional elements are so arranged relative to one another that a smallest angle of intersection included between their imaginary principle ray axes extended over the third functional element amounts to less than 120°, especially less than 90°. In a further development of this embodiment of the invention, the two optoelectronic functional elements are so arranged relative to one another that the smallest angle of intersection included between their imaginary principle ray axes amounts to less than 10°, especially is about zero degrees.

In an eighth embodiment of the invention, it is provided that at least the two optoelectronic, functional elements are affixed on a support, especially a support embodied as a circuit board and/or a support which is essentially planar. In a first further development of the eighth embodiment of the invention, it is additionally provided that the third functional element is affixed on the support and/or is secured to the support by means of a holding apparatus, especially a holding apparatus which encases it. In a second further development of the eighth embodiment of the invention, it is additionally provided that the support is formed essentially planarly. Further, the third functional element and the support are so oriented with respect to one another that a smallest angle of intersection included between the surface normals of the at least one planar boundary surface of the third functional element and a surface normal of a surface of the planar support facing the third functional element amounts to more than 5°, especially is greater than 10°, and/or amounts to less than 60°, especially is smaller than 40°. In a third further development of the eighth embodiment of the invention, it is additionally provided that the third functional element contacts the support between the two optoelectronic, functional elements. In a fourth further development of the eighth embodiment of the invention, it is additionally provided that the third functional element is affixed to the support between the two optoelectronic, functional elements. In a fifth further development of the eighth embodiment of the invention, the support is essentially planar and the first functional element is so placed on the support that a smallest angle of intersection included between the principal ray axis of the first functional element and a surface normal of a surface of the support facing the third functional element amounts to less than 10°, especially is about zero degrees, and/or the second functional element is so placed on the support that a smallest angle of intersection included between the principal ray axis of the second functional element and a surface normal of a surface of the support facing the third functional element amounts to less than 10°, especially is about zero degrees.

In a ninth embodiment of the invention, the apparatus further includes a coupler housing, which at least partially encases the third functional element. In a first further development of the-ninth embodiment of the invention, it is additionally provided that the coupler housing is composed, at least in part, of a material, especially a plastic, which is opaque, especially within a spectral region, in which the apparatus works. In a second further development of the ninth embodiment of the invention, it is additionally provided that at least the third functional element is affixed to the support, at least in part, by means of the coupler housing. In a third further development of the ninth embodiment of the invention, it is additionally provided that the coupler housing is composed, at least partially, of a material, especially a plastic, which is opaque, especially within a spectral region in which the apparatus works.

In a tenth embodiment of the invention, it is provided that the first functional element is formed by means of a light-emitting diode.

In an eleventh embodiment of the invention, it is provided that the first functional element is formed by means of a laser diode.

In a twelfth embodiment of the invention, it is provided that the second functional element is formed by means of a photodiode.

In a thirteenth embodiment of the invention, it is provided that the second functional element is formed by means of a phototransistor.

In a fourteenth embodiment of the invention, it is provided that the second functional element is formed by means of a photothyristor.

In a fifteenth embodiment of the invention, it is provided that the third functional element is sectionally, lens-shaped.

In a sixteenth embodiment of the invention, it is provided that the third functional element is composed, at least partially, of plastic.

In a seventeenth embodiment of the invention, it is provided that the third functional element is composed, at least partially, of polycarbonate.

In a eighteenth embodiment of the invention, it is provided that the third functional element is composed, at least partially, of glass.

In a nineteenth embodiment of the invention, it is provided that the third functional element is formed by means of a one-piece, especially solid and/or rigid, plastic body.

In a twentieth embodiment of the invention, it is provided that the third functional element is formed by means of a one-piece, especially solid and/or rigid, glass body.

In a twenty-first embodiment of the invention, it is provided that the third functional element works in an infrared spectral region.

In a twenty-second embodiment of the invention, it is provided that the two optoelectronic, functional elements are constructed in such a manner and arranged so spaced from one another that a minimum separation between a connection of the first functional element carrying electrical current during operation and a connection of the second functional element carrying electrical current during operation amounts to at least 10 mm.

A further aspect of the invention resides in the fact that the apparatus of the invention is usable as an optocoupler, carrying, for example, analog and/or digital signals between galvanically separated, electrical current circuits, especially in a field device of industrial measurements and automation technology, especially in a measuring device of industrial measurements and automation technology suitable for use in explosion-endangered areas.

In particular, there are now a plurality of opportunities for further embodiments and developments of the apparatus of the invention, especially by combination and/or omission of individual features. Regarding such advantageous embodiments and developments of the invention, reference is made, among others, also to the patent claims.

BRIEF DESCRIPTION OF THE DRAWINGS

The invention, as well as further advantageous embodiments thereof, will now be explained in greater detail on the basis of the figures of the drawing. Equal parts are given the equal reference characters throughout. However, to avoid crowding, or where unnecessary, reference characters may be omitted in subsequent figures. The figures show as follows.

DETAILED DESCRIPTION OF EXEMPLARY EMBODIMENTS

While the invention is susceptible to various modifications and alternative forms, exemplary embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention as defined by the intended claims.

Figure 1:
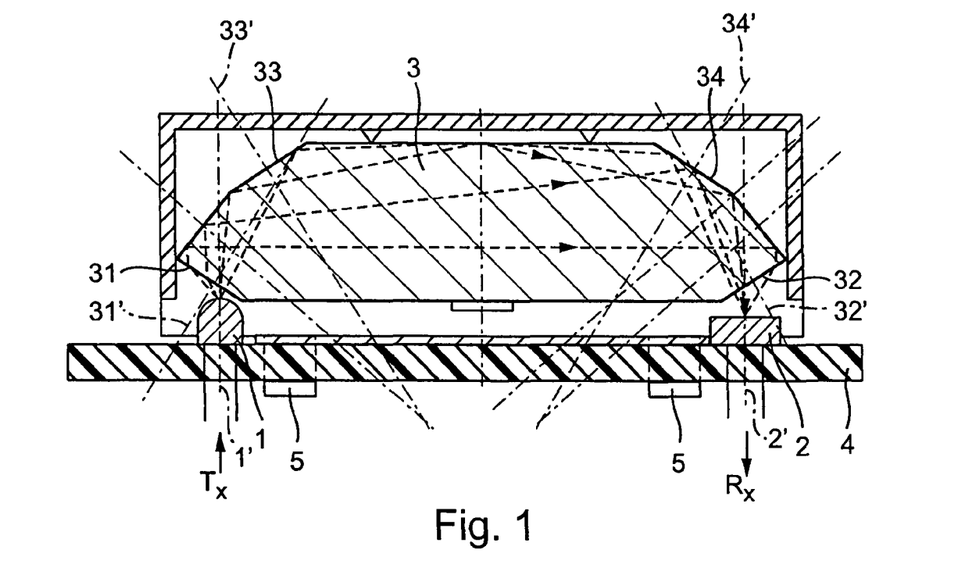
FIG. 1 schematically, in a sectioned, side view, an optoelectronic apparatus, especially such as is usable as an optocoupler, having a light-emitting, optoelectronic, functional element, a light-sensitive, optoelectronic, functional element, and a light-conducting, functional element composed, at least partially, of transmissive material, such as e.g. translucent plastic or glass.

FIG. 1 shows an example of an embodiment for an optoelectronic apparatus, especially an apparatus usable as an optocoupler. The apparatus includes a light-emitting, optoelectronic, first, functional element 1, a light-sensitive, optoelectronic, second, functional element 2, and a light conduction capable, or light conducting, third functional element 3 placed between the two optoelectronic, functional elements. Functional element 3 is composed, at least partially, of transmissive material for conveying light coupled thereinto, for example light in an infrared and/or red spectral region, in which possible disturbances by environmental light can be especially effectively prevented. Fundamentally, however, the spectral region, in which the apparatus works, is almost arbitrary, so long as the spectral regions of the individual functional elements fit with one another and the third functional element is an effective light conductor in such spectral region, thus that it is sufficiently transmissive and, at least sectionally, totally reflecting.

The first functional element 1 serves for emitting, at least at times, light, and functions, as a result, practically, as the transmitter of the apparatus. To this end, functional element 1 is activated during operation, at least at times, by a corresponding electrical signal Tx. As first, functional element 1 can be, for example, a light-emitting diode or a laser diode working in the infrared and/or red spectral region. In case required, the optoelectronic, first, functional element 1 can, however, also work in another spectral region suitable for the actual area of application of the optoelectronic apparatus.

The second functional element 2 is, in turn, activated during operation by light falling, at least at times, thereon, and serves for delivering during operation, at least at times, a suitable electrical signal Rx corresponding essentially with the signal Tx activating the transmitter 1. The second functional element 2 thus functions as the receiver of the apparatus. The second functional element 2 can be, for example, a photodiode working, at least partially, also within the spectral region of the first functional element 1—here, thus, in the infrared and/or red spectral region. Alternatively to this, the optoelectronic, second, functional element can be formed, for example, also by means of a suitable phototransistor or photothyristor.

Each of the two optoelectronic, functional elements 1, 2 has at least one, and, on occasion, in fact, only one, imaginary, principal ray axis. The imaginary principal ray axis 1' of the first functional element 1 represents a direction of maximum intensity of light emitted during operation by the first functional element 1 and the imaginary principal ray axis 2' of the second functional element 2 represents a direction of its maximum sensitivity to light falling on it during operation. In an embodiment of the invention, it is further provided that the two optoelectronic, functional elements 1, 2 are so arranged relative to one another that a smallest angle of intersection included between their imaginary principal ray axes extended over the third functional element 3 amounts to less than 120°, especially less than 90°. In an advantageous further development thereof, it is additionally provided that the two optoelectronic, functional elements 1, 2 are so arranged relative to one another that the aforementioned smallest angle of intersection amounts to less than 10°, especially is about zero degrees. For the last-mentioned case, this means that the two optoelectronic, functional elements 1, 2 are so arranged that their two principal ray axes 1', 2' extend essentially parallel to one another.

Mediating between the two optoelectronic, functional elements is the third functional element 3, which is transmissive at least in the spectral region of the two optoelectronic, functional elements 1, 2. It functions, thus, as the light-conductor of the apparatus and can be composed, for example, of a translucent plastic, such as, depending on application, a polycarbonate, or a glass. Most known transmissive glass or plastic materials are usable as material for the light conductor. In the case of use in an explosion-endangered area, however, the material for the light conductor must be incombustible, or at least only difficultly flammable, as well as have, to the extent required, a sufficiently high temperature stability. In another embodiment of the invention, the third functional element 3 is formed by means of a one-piece, especially solid and/or rigid, glass body or an equal, one-piece, plastic body, which can be produced, for example, in an injection molding process.

For in- and out-coupling of light, the third functional element 3 has a first boundary surface 31 facing the first functional element 31 and in-coupling light emitted thereby, as well as a second boundary surface 32 facing the second functional element and out-coupling internally conveyed light thereto. The functional elements 1, 2, 3 are, in such case, so constructed and so arranged relative to one another that the light in-coupling, first boundary surface 31 is intersected at least by the imaginary principal ray axis 1' of the first functional element 1 and the light out-coupling, second boundary surface 32 is intersected at least by the imaginary principal ray axis 2' of the second functional element. In other words, the optoelectronic, functional elements 1, 2 are so arranged in the apparatus relative to the, in each case, corresponding light-coupling boundary surface, that a radiating region of the first functional element and a receiving region of the second functional element are directed onto the third functional element 3. For this purpose, in the case of the apparatus shown in the example of an embodiment, the first boundary surface is situated in an outer region of the third functional element opposite to the first functional element and at least partially overlapping such, and the second boundary surface is situated in an outer region of the third functional element opposite to the second functional element and at least partially overlapping such. As indicated in the figure with an arrow leading from the first functional element 1 to the second functional element 2, the light emitted by the transmitter 1 and coupled into the light-conductor 3 via the first boundary surface 31 impinges on at least a third boundary surface 33 of the light-conductor 3. Boundary surface 33 is spaced from the first boundary surface and extends at least sectionally inclined to a direction of propagation of the light. In an embodiment of the invention, this third boundary 33 is so constructed that it serves as a reflection surface, for example a totally reflecting surface, for light conveyed in the third functional element, especially light to be guided to the second functional element.

Total reflection on the boundary surfaces provided therefor is achieved, on the one hand, by using as material for the light conductor a material having relative to the environment, for example air, a sufficiently high index of refraction in the spectral region being used, and, on the other hand, by selecting an appropriate inclination of the boundary surface with respect to the critical angle for total reflection, so that light conveyed within the light-conductor impinges on the light-reflecting boundary surfaces grazing as much as possible in sufficient measure for the desired light coupling factor. For the above-described case, in which a solid plastic, or glass, body serves as light-conductor, also the in-coupling of the light into the light conductor is made easier. Especially, a complicated orienting of a light-conductor embodied, for example, as a flexible fiber, with respect to the transmitter or the receiver is avoided.

In a further embodiment of the invention, the third functional element is additionally so constructed and oriented relative to the first optoelectronic, functional element that the light impinging on the third boundary surface during operation is at least partially so reflected there that it is deflected to a fourth boundary surface 34 of the light conductor removed from the third boundary surface. This fourth boundary surface again extends inclined with respect to the propagation direction of the light reflected from the third boundary surface. Following another reflection within the light conductor 3 on this fourth boundary surface 34, the light, at least, as a result, multiply reflected within the light conductor 3, and thus multiply re-directed, is then out-coupled out of the light-conductor 3 in such a manner that it impinges, at least in part, onto the receiver 2 associated with the second boundary surface 32.

As evident from the above explanations, the light conduction capable, third functional element 3 of the apparatus of the invention has a plurality of light deflecting boundary surfaces 31, 32, 33, 34 for light conveyed within the apparatus during operation; here, these are the light-coupling first and second boundary surfaces 31, 32, as well as the third, and, as required, fourth, boundary surfaces 33, 34, which are, at least in part, totally reflecting. In the case of the apparatus of the invention, it is, especially, provided that, of these light deflecting boundary surfaces 31, 32, 33, at least one is essentially planarly formed and additionally has a surface normal 31', 32', 33', 34', which is inclined at least with respect to the main ray axis 1', 2' of at least one of the two optoelectronic, functional elements 1, 2.

In case required, one or more of the aforementioned boundary surfaces, for example, the reflecting third and/or fourth boundary surface 33, 34 of the light-conductor can be curved; compare, in this connection, also the initially mentioned U.S. Pat. No. 6,947,620. In a further embodiment of the invention, the at least one reflecting boundary surface of the third functional element 3 is, however, formed essentially planarly, whereby a very simplified manufacture of the third functional element 3 is possible. By way of example, the at least one, light-reflecting, boundary surface can then be formed very simply by means of a facet formed in the third functional element, for example in the glass or plastic body forming the light-conductor.

In a further embodiment of the invention, the third boundary surface 33 is oriented inclined with respect to the direction of propagation of the light coupled via the first boundary surface 31 into the light conductor in such a manner that, during operation, light impinging on the third boundary surface is at least partially, especially predominantly, totally reflected. In supplementation thereof, in a further embodiment of the invention, the fourth boundary surface is oriented inclined with respect to the propagation direction of the light deflected during operation via the third boundary surface to the fourth boundary surface in a manner such that the latter is at least partially, especially predominantly, totally reflected. The aforementioned, as required also totally reflecting, fourth boundary surface of the light conductor 3 can be curved, for example in the same way as the third boundary surface. In the example of an embodiment of the invention described here, this fourth boundary surface is, however, planarly formed and can, therefore, as already mentioned above in connection with the third boundary surface, be formed by means of a facet formed in the third functional element. In a further embodiment of the invention, the third functional element, as also shown in FIG. 1, is so constructed further such that both the reflecting third as well as also the reflecting fourth boundary surface is formed planarly.

In a further embodiment of the invention, the third functional element 3 is further so constructed that at least one of the two light coupling boundary surfaces 31, 32 of the third functional element 3—here thus the first and/or the second boundary surface—is formed essentially planarly. Additionally, the third functional element in the case of the apparatus of the invention is so formed and arranged relative to the two optoelectronic, functional elements that the at least one planar, light-coupling boundary surface of the third functional element 3 has a surface normal 31', 32', which is inclined, at least relative to the principal ray axis 1', 2' of at least one of the two optoelectronic, functional elements 1, 2. In a further embodiment of the invention, the third functional element 3 is further so constructed and arranged relative to the two optoelectronic, functional elements 1, 2, that, as shown in FIG. 1, the surface normal 31' and/or 32' of its at least one essentially planar, light-coupling, boundary surfaces 31, 32 are/is inclined at least relative to the principal ray axis 1', 2' of the corresponding optoelectronic, functional element 1, 2. As a result of this, light passing this boundary surface is refracted according to the refraction law of Snell relative to the corresponding principal ray axis 1', 2' of the corresponding functional element 1, 2. For the case, in which, here, at least the first boundary surface 31 associated with the first functional element 1 is inclined relative to its principal ray axis 1', the first boundary surface 31 is additionally inclined relative to its at least one essentially planar, light-reflecting boundary surface 33 in such a manner that the smallest angle of intersection included between their two surface normals 1', 31' amounts to more than 10°, especially is greater than 30°.

In order to enable a highest possible efficiency combined simultaneously with a construction which is as compact and simple as possible for the entire optoelectronic apparatus, a further advantageous embodiment of the invention provides that the functional elements 1, 2 and 3 of the apparatus are so formed and so arranged relative to one another that the surface normal 31', 32' of the at least one, inclined, planar, light coupling boundary surface 31, 32 of the third functional element 3 is inclined both relative to the principal ray axis 1' of the first functional element 1 as well as also relative to the principal ray axis 2' of the second functional element 2. In a further development of this embodiment of the invention, this at least one, light-coupling, planar, boundary surface is so inclined that, in the case of the first boundary surface coupling light into the light conductor, as shown schematically in FIG. 1, light entering there is refracted away from the principal ray axis 1' of the corresponding optoelectronic, first functional element and/or that in the case of the second boundary surface coupling light out of the light conductor, as shown schematically in FIG. 1, light exiting there is refracted toward the principal ray axis 2' of the corresponding optoelectronic, second functional element.

In a further embodiment of the apparatus of the invention, at least the essentially planar, light-reflecting, third boundary surface of the third functional element 3 has, as already indicated above, a surface normal 33', which includes with the principal ray axis 1', 2' of at least one of the optoelectronic, functional elements 1, 2 a smallest angle of intersection, which is greater than zero degrees, especially lying in an angular range between 10° and 90°. Alternatively or in supplementation, at least the essentially planar, light-reflecting, third, boundary surface of the third functional element 3 has a surface normal, which includes with the surface normal of the at least one, planar, light-coupling, boundary surface 31, 32 a smallest angle of intersection, which is greater than zero degrees.

Also the at least one, light-coupling, boundary surface 31, 32, can, as already mentioned in connection with the light reflecting boundary surfaces 33, 34, be created by means of a facet formed in the third functional element 3, for example ground into the glass or plastic body forming the light-conductor. In case required, the other of the two light-coupling, boundary surfaces 31, 32 can be lens-shaped. However, in a further embodiment, it is provided that each of the two light-coupling boundary-surfaces 31, 32 of the third functional element is formed essentially planarly, for example, in each case, in the form of a facet. Additionally, it can be of advantage, when, in such case, each of the two planar, light-coupling, boundary surfaces 31, 32 of the third functional element 3 has, in each case, a surface normal, which is inclined, at least relative to the principal ray axis 1', 2' of its associated optoelectronic, functional element 1, 2.

For ensuring symmetry and, associated therewith, simplification of manufacture of the apparatus of the invention, it can, furthermore, be of advantage so to form the functional elements and so to orient them with respect to one another that the surface normal 31' of the light-coupling, first boundary surface includes with the principal ray axis 1' of the corresponding first functional element 1 a smallest angle of intersection that is essentially equal to a smallest angle of intersection included between the surface normal 32' of the light-coupling, second boundary surface 32 and the principal ray axis 2' of the corresponding second functional element 2. In a further development of this embodiment of the invention, the two planar light-coupling boundary surfaces 31, 32 are so oriented with respect to one another and so arranged at the third functional element 3 that a smallest angle of intersection included between their surface normals 31', 32' extended over the third functional element 3 amounts to less than 120°, especially less than 90°. Further, the two planar light-coupling boundary surfaces 31, 32, in a further advantageous embodiment of the invention, are so oriented with respect to one another that the smallest angle of intersection included between their surface normals 31', 32' amounts to more than 10°, especially more than 20°.

For the above-described case, in which both each of the two light-coupling boundary surfaces 31, 32 as well as also at least two light-reflecting boundary surfaces 33, 34 of the third functional element 3 are formed essentially planarly, in a further embodiment of the invention, the light-coupling, first boundary surface 31 of the third functional element 3 corresponding with the first functional element 1 is inclined relative to its essentially planar, light-reflecting, third boundary surface 33, as well as the light-coupling second boundary surface 32 of the third functional element 3 corresponding with the second functional element 2 is inclined relative to its essentially planar, light-reflecting, fourth boundary surface 34, in such manner that both the smallest angles of intersection included, in each case, between the surface normals 31', 33' of the first and third boundary surfaces 31, 33, as well as also between the surface normals 32', 34' of the second and fourth boundary surfaces 32, 34 amounts to more than 10°, especially is greater than 30.

From the combined above-explanations, it is clear for those skilled in the art that a further aspect of the apparatus of the invention is to be seen in the fact that the third functional element serving as light conductor, is to be constructed such that it has at least one facet, which is, on the one hand, essentially planar and, on the other hand has a surface normal, which is inclined relative to the principal ray axis 1', 2' of the first and/or second functional element 1, 2. Especially, the facet is, in such case, so formed, that the smallest angle of intersection included between its surface normal and the surface normal 31', 32', 33', 34' of the at least one planar boundary surface 31, 32, 33, 34 of the functional element 3 is greater than 10° and smaller than 90°.

In order to achieve a further improvement of the efficiency of the apparatus combined with retained simplest possible and most compact possible manner of construction of the light-conductor 3 and, as a result, also of the entire apparatus, such is so formed in a further embodiment of the invention that it has a plurality of essentially planar, light-reflecting boundary surfaces 33, 34 for light conveyed within the light-conductor 3, especially light to be guided to the second functional element 2, and that these boundary surfaces 33, 34 are inclined relative to one another, in each case, by an angle of inclination different from zero degrees. In such case, these light-, for example, totally, reflecting boundary surfaces can be constructed again as planar facets in the light conductor. Lastly, the third functional element 3 is thus formed in such a manner that it describes, at least in a side view—here that shown in FIGS. 1 and 2—a convex polygon with n vertices, with n being, as evident from the above explanations, or clearly evident also from FIG. 1 or 2, at least greater than three. In such case, the use of a light conductor with a plurality n−1 of such facets represents, as compared to one with lenses, for example as proposed in the mentioned U.S. Pat. No. 6,947,620, a considerable simplification in construction and thus also in manufacture of the light-conductor, at completely comparable efficiency and light-coupling factor. Moreover, efficiency or coupling factor can be improved in very simple manner by corresponding increase of the number of facets and can thus be matched to the requirements placed in practice on the optoelectronic apparatus of the invention. In an embodiment, the number of light-coupling and light-reflecting facets is therefore so selected for the light-conductor 3 that it is equal to or greater than five.

Figure 2:
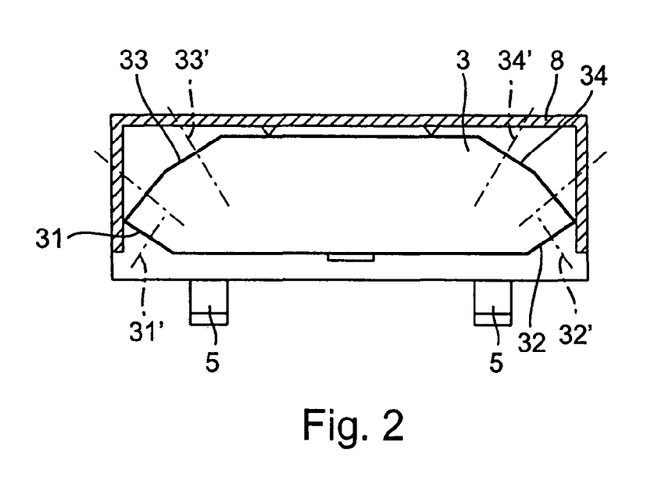
FIG. 2 schematically, in a sectioned, first side view, a light-conducting, functional element suitable for the apparatus of FIG. 1.
Figure 3:
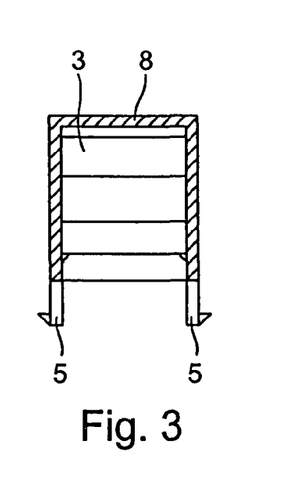
FIG. 3 schematically, in a sectioned, second side view, the light-conducting, functional element of FIG. 2.

For simplifying manufacture of the light-conductor, such is, in a further embodiment of the invention, embodied in such a manner that the polygon described by its side view is essentially symmetrically constructed with respect at least to a principal axis in such side view. Further, the third functional element 3 serving as light conductor is embodied in such a manner that an imaginary axis of symmetry of the polygon described by the side view of the third functional element forms with each of the two principal ray axes essentially equal angles of intersection.

In a further embodiment, for assuring a sufficient explosion protection, the functional elements are dimensioned and arranged relative to one another in such a manner that a minimum separation between a connection of the first optoelectronic, functional element 1 carrying electrical current during operation and a connection of the second optoelectronic, functional element carrying electrical current during operation amounts to at least 10 mm.

As can be seen from FIG. 1, at least the two optoelectronic, functional elements shown here, essentially planar. Support 4 can be constructed in advantageous manner as a circuit board, which carries, in addition to the two optoelectronic, functional elements, as required, also other electronic and/or electrical components. As already indicated above and recognizable from the figure, the optoelectronic, functional element 1 serving as transmitter and the optoelectronic, second functional element 2 serving as receiver are, in such case, in each case, so arranged on the support 4, that their respective radiating and receiving regions point away from the support 4, toward the light conductor 3. Such an arrangement of the optoelectronic, functional elements 1, 2 on a planar support 4 is very simple and can be effected, for example, directly by means of surface mounting of transmitter and/or receiver and thus also in the course of an automated, or partially automated, populating of the circuit board. In other words, transmitter 1 and receiver 2 can be so pre-mounted directly on a circuit board or other support with respect to position and relative separation that they then can later be used as such within the optoelectronic apparatus. Because of its relatively high tolerance with respect to almost unavoidable, exemplar variations in the individual functional elements, be it due to manufacturing tolerances or on the basis of deviations associated with their mounting, the apparatus of the invention can, in such case, even under use of conventional automatic populating machines, assuming an appropriately accurate calibration of the same, be manufactured with a very high quality and precision in the sense of achieving sufficient optical efficiency or coupling factor. Therefore, any subsequent manual aligning of the three functional elements 1, 2, 3 following their mounting on the support 3 should be relatively minor.

For the above-described case in which the support 4 and a light-coupling boundary surface 31, 32 of the third functional element 3 are, in each case, planarly formed, a further embodiment of the apparatus of the invention provides that the third functional element 3 and the support 4 are so oriented with respect to one another that a smallest angle of intersection included between the surface normal of the at least one, inclined, planar, light-coupling boundary surface 31, 32 and a surface normal of an essentially planar surface 4' of the support 4 facing the third functional element 3 amounts to more than 5°, especially is greater than 10°. Further, it is provided that the functional element 3 and the support 4 are so dimensioned that the smallest angle of intersection included between the two aforementioned surface normals amounts to less than 60°, especially is smaller than 40°. In another embodiment, it is further provided that the first functional element 1 is so placed on the planar support 4, that a smallest angle of intersection included between the principal ray axis of the first functional element 1 and the surface normal of the surface 4' of the support 4 facing the third functional element amounts to less than 10°, especially is about zero degrees, and/or that the second functional element 2 is so placed on the support 4, that a smallest angle of intersection included between the principal ray axis of the second functional element 2 and the surface normal of the surface 4' of the support 4 facing the third functional element amounts to less than 10°, especially is about zero degrees.

In a further embodiment of the invention, it is additionally provided that also the third functional element 3 is affixed to the support 4. It can, for such purpose, as also proposed, for example, in U.S. Pat. No. 6,947,620, be embodied in such a manner that it can be secured between the two optoelectronic, functional elements 1, 2 directly on the support 4, especially such in the form of a circuit board. This can, as also shown in the aforementioned U.S. Pat. No. 6,947,620, be done, for example, by means of hooks, which deflect in, and then engage with, corresponding bores in the support, and/or by means of adhesive strips between functional element 3 and support 4. In case required, for example for reasons of stabilization, the third functional element 3 can sectionally flushly contact the support 4 between the two optoelectronic, functional elements 1, 2.

Alternatively to, or in supplementation of, the aforementioned, direct affixing of the third functional element 3 on the support 4, this can, as shown in FIG. 1, also be secured to the support 4 by means of a holding apparatus, especially also without contacting the support directly or immediately. The holding apparatus, which, for example, encases the functional element 3 completely, or at least partially, can, in such case, likewise be affixed to the support by means of engaging hooks 5 and/or by means of adhesive connections. Moreover, it is, however, also possible to affix the light conductor to the circuit board by means of a press fit, thus e.g. by pressing cross sectionally rectangular or square legs of the light conductor into round holes in the circuit board or by means of the securement technology for electronic components on circuit boards disclosed in WO-A 05/091689. Furthermore, the legs of the light conductor can also be equipped with engagement hooks, which lock in correspondingly provided bores in the support.

In a further development of the invention, the apparatus further includes a coupler housing 8, which at least partially encases the third functional element 3. The coupler housing 8 is composed in advantageous manner at least partially of a material, for example a plastic, which is opaque, thus impenetrable by light, especially within a spectral range in which the apparatus mainly works. In a further embodiment of the invention, it is additionally provided, that at least the third functional element 3 is affixed on the support 4 at least in part, by means of the coupler housing 8. For example, for this purpose, the above mentioned holding apparatus can at least partially be embodied as an integral component of the coupler housing 8.

As is evident from the combination of the above explanations, the light-conducting, third functional element is distinguished especially by a geometrically very simple, but nevertheless optically very effective construction. This enables also, on the whole, a relatively simple construction of the apparatus of the invention, especially with respect to the usually very simple mounting of the three functional elements. Moreover, the apparatus of the invention is also, on this basis, very economical to manufacture, especially as regards the fact that conventional optoelectronic components can be used for transmitter and receiver, especially also components which need not necessarily satisfy highest requirements as regards precision or component variation.

As a result of the above-described inclination of the planar, light-deflecting, boundary surfaces, especially of the first and/or second, light-coupling boundary surface of the light-conducting, functional element 3, the apparatus of the invention is relatively insensitive to possible deviations from installed positions of the individual functional elements 1, 2 or 3 from optimum for the optical transmission, for example deviations resulting from tilting and/or shifting. Due to this, the individual functional elements 1, 2, 3 of the apparatus can be adjusted very accurately relative to one another with comparatively little technical effort. In such case, as already mentioned, mounting and aligning of the individual functional elements can be brought about in advantageous manner also in the course of a largely automated populating of a circuit board, especially also a surface-mounted circuit board.

A further advantage of the invention is also to be seen, among others, in the fact that the apparatus of the invention, despite its relatively simple construction, can have a very high coupling factor, or efficiency. Consequently, the apparatus is very well suited for safe transmission of analog and/or digital signals, especially also those of low electrical power and/or comparatively high clock- and/or signalcarrier-frequency. Especially, the apparatus of the invention is therefore also usable as an optocoupler, especially an optocoupler transmitting analog and/or digital signals, between galvanically separated, electrical current circuits, for example in a field device of industrial measurements and automation technology. Given adequate dimensioning in the sense of the above-mentioned explosion protection, the apparatus of the invention can very well also be used as an optocoupler in a field device of industrial measurements and automation technology suited for use in explosion-endangered areas and/or constructed in the form of a measuring device.

While the invention has been illustrated and described in detail in the drawings and forgoing description, such illustration and description is to be considered as exemplary not restrictive in character, it being understood that only exemplary embodiments have been shown and described and that all changes and modifications that come within the spirit and scope of the invention as described herein are desired to protected.

What is claimed is:

1. An optoelectronic apparatus, comprising:
at least one light-emitting, optoelectronic, first functional element, said first functional element, during operation, activated by an electrical signal, emitting light, at least at times, and said first functional element showing an imaginary principal ray axis representing a direction of maximum intensity of light emitted by said first functional element during operation;
at least one light-sensitive, optoelectronic, second functional element, said second functional element, during operation, activated by light falling thereon, delivering, at least at times, an electrical signal, and said second functional element showing an imaginary principal-axis representing a direction of maximum sensitivity of said second functional element to light incoming during operation; as well as
at least a third functional element composed, at least partially, of transmissive material, said third functional element, during operation, conveying light coupled thereinto, and said third functional element including at least one, essentially planar, boundary surface, which deflects light conveyed in the apparatus, said at least one, essentially planar, light deflecting, boundary surface of the third functional element showing a surface normal, which is inclined at least with respect to the principal axis at least of one of said first and second optoelectronic, functional elements, wherein:
the third functional element includes a first boundary surface facing the first functional element, as well as a second boundary surface facing the second functional element, said first boundary surface coupling light, emitted during operation by the first functional element, into the third functional element, and said second boundary surface coupling light, conveyed within the third functional element during operation, out in the direction of the second functional element;
at least one of said first and second light coupling, boundary surfaces of the third functional element is formed essentially planarly and shows a surface normal, which is inclined at least with respect to the principal ray axis at least of one of the two optoelectronic, functional elements;
each of said first and second light-coupling, boundary surfaces of the third functional element is formed planarly;
each of the two light-coupling, boundary surfaces of the third functional element shows a surface normal, which is inclined relative to the principal ray axis of its corresponding optoelectronic, functional element;
the first and second light-coupling, boundary surfaces of the third functional element are so oriented with respect to one another and so arranged at the third functional element that a smallest angle of intersection included between their surface normals extended out over the third functional element amounts to less than 120°; and
the first and second light-coupling, boundary surfaces of the third functional element are so oriented with respect to one another and so arranged at the third functional element that a smallest angle of intersection included between their surface normals extended out over the third functional element amounts to more than 10°.

2. The apparatus as claimed in claim 1, wherein:
the surface normal of the at least one, essentially planar, light-deflecting, boundary surface of the third functional element is inclined both with respect to the principal ray axis of the first functional element as well as also with respect to the principal ray axis of the second functional element; and/or
the third functional element includes a plurality of essentially planar, light-deflecting boundary surfaces for light conveyed in the third functional element, said light-deflecting boundary surfaces totally reflecting light to be conveyed to the second functional element; and/or
the third functional element is formed in such a manner that a side view thereof describes a convex polygon with more than three vertices; and/or
the at least one planar light-deflecting boundary surface of the third functional element is formed by means of a facet formed therein; and/or
the third functional element includes a plurality of facets forming essentially planar, light-deflecting, boundary surfaces for light conveyed in the third functional element; and/or
the third functional element is formed by means of a one-piece plastic body.

3. The apparatus as claimed in claim 1, wherein:
the surface normal of the at least one, essentially planar, light-coupling, boundary surface of the third functional element is inclined at least with respect to the principal ray axis of the corresponding optoelectronic, functional element; and/or
the third functional element includes at least one essentially planar, third boundary surface, which, during operation, reflects light conveyed within the third functional element; and/or
each of said first and second light-coupling, boundary surfaces of the third functional element is formed essentially planarly; and/or the third functional element is composed, at least partially, of glass; and/or the third functional element is composed, at least partially, of plastic.

4. The apparatus as claimed in claim 1, wherein:

the functional elements are so formed and so oriented with respect to one another that the surface normal of the first boundary surface of the third functional element includes with the principal ray axis of the corresponding first functional element a smallest angle of intersection, which is essentially equal in size to a smallest angle of intersection included between the surface normal of the second boundary surface of the third functional element and the principal ray axis of the corresponding second functional element.

5. The apparatus as claimed in claim 4, wherein:

the first and second light-coupling, boundary surfaces of the third functional element are so oriented with respect to one another and so arranged at the third functional element that a smallest angle of intersection included between their surface normals extended out over the third functional element amounts to less than 90°; and/or the first and second light-coupling, boundary surfaces of the third functional element are so oriented with respect to one another and so arranged at the third functional element that a smallest angle of intersection included between their surface normals extended out over the third functional element amounts to more than 20°.

6. The apparatus as claimed in claim 1, wherein:

the third functional element includes at least one essentially planar, third boundary surface, which, during operation, reflects light conveyed within the third functional element.

7. The apparatus as claimed in claim 6, wherein:

at least the light-reflecting third boundary surface of the third functional element shows a surface normal, which includes with the surface normal of at least one of said first and second light-coupling boundary surfaces of the third functional element a smallest angle of intersection that is greater than zero degrees.

8. The apparatus as claimed in claim 7, wherein:

the light-coupling, first boundary surface of the third functional element is inclined at least with respect to said light-reflecting, third, boundary surface in such a manner that said smallest angle of intersection included between the surface normal of said first boundary surface and the surface normal of said third boundary surface amounts to more than 10°.

9. The apparatus as claimed in claim 1, wherein:

the third functional element is formed in such a manner that a side view thereof describes a convex polygon with n vertices, with n is greater than three.

10. The apparatus as claimed in claim 9, wherein:

the third functional element is formed in such a manner that said side view thereof describes a convex polygon with five or more vertices; and/or the third functional element is formed in such a manner that the polygon described by the side view of the third functional element is formed essentially symmetrically with respect at least to a principal axis of such side view; and/or the third functional element is formed in such a manner that an imaginary axis of symmetry of the polygon described by the side view of the third functional element includes with each of the two principal ray axes essentially an equal angle of intersection; and/or the third functional element includes a plurality of facets forming essentially planar, light-deflecting, boundary surfaces for light conveyed in the third functional element; and/or the third functional element is formed by means of a one-piece glass body; and/or the first and second optoelectronic, functional elements are so arranged relative to one another that a smallest angle of intersection included between the imaginary principal ray axis of the first optoelectronic, functional element and the imaginary principal ray axis of the second optoelectronic, functional element extended over the third functional element amounts to less than 90°.

11. The apparatus as claimed in claim 1, wherein:

the first and second optoelectronic, functional elements are so arranged relative to one another that a smallest angle of intersection included between the imaginary principal ray axis of the first optoelectronic, functional element and the imaginary principal ray axis of the second optoelectronic, functional element extended over the third functional element amounts to less than 90°.

12. The apparatus as claimed in claim 11, wherein:

the first and second optoelectronic, functional elements are so arranged relative to one another that said smallest angle of intersection included between their imaginary principal ray axes lies in a range between 10° and about zero degrees.

13. The apparatus as claimed in claim 1, wherein:

at least the first and second optoelectronic, functional elements are affixed on a support.

14. The apparatus as claimed in claim 13, wherein:

the third functional element is secured to the support by means of a holding apparatus; and/or the third functional element is encased at least partially; and/or the support is essentially planar, and wherein the third functional element and the support are so oriented with respect to one another that a smallest angle of intersection included between the surface normal of the at least one planar boundary surface of the third functional element and a surface normal of a surface of the support facing the third functional element amounts to more than 5°; and/or a smallest angle of intersection included between the surface normal of the at least one planar boundary surface of the third functional element and the surface normal of the surface of the support facing the third functional element amounts to less than 60°; and/or the third functional element contacts the support between the two optoelectronic, functional elements; and/or the third functional element is affixed to the support between the two optoelectronic, functional elements; and/or the support is essentially planar and wherein the first functional element is so placed on the support, that a smallest angle of intersection included between the principal ray axis of the first functional element and a surface normal of a surface of the support facing the third functional element amounts to less than 10°; and/or the support is essentially planar and wherein the second functional element is so placed on the support, that a smallest angle of intersection included between the principal ray axis of the second functional element and a surface normal of a surface of the support facing the third functional element amounts to less than 10°.

15. The apparatus as claimed in claim 1, further comprising:
a coupler housing, which at least partially encases at least the third functional element.

16. The apparatus as claimed in claim 15, wherein:
the coupler housing is composed at least partially of an opaque material; and/or
the coupler housing is composed at least partially of a plastic.

17. The apparatus as claimed in claim 1, further comprising:
a coupler housing and a planar support, at least said first and second functional elements being affixed to said support and said coupler housing at least partially encasing at least the third functional element, wherein at least the third functional element is secured to the support at least in part by means of the coupler housing.

18. The apparatus as claimed in claim 1, wherein:
each of the three functional elements works in an infrared spectral region; and/or
the two optoelectronic, functional elements are constructed in such a manner and arranged so spaced from one another, that a minimum separation between a connection of the first functional element conveying electrical current during operation and a connection of the second functional element conveying electrical current during operation amounts to at least 10 mm; and/or the first functional element comprises a light-emitting diode; and/or
the second functional element comprises at least one light-sensitive, optoelectronic, element selected from a group consisting of:
a photodiode, a phototransistor, and a photothyristor,
the third functional element is sectionally lens-shaped; and/or
the third functional element is composed, at least partially, of translucent plastic; and/or
the third functional element is composed, at least partially, of glass.

19. Use of an apparatus as claimed in claim 1:
as an optocoupler for transmitting analog and/or digital signals between galvanically separated electrical current circuits; and/or
as an optocoupler for transmitting analog and/or digital signals between electrical current circuits in a field device of industrial measurements and automation technology; and/or
as an optocoupler for transmitting analog and/or digital signals in a field device suited for use in explosion-endangered areas and/or embodied as a measuring device.

* * * * *